US012111571B2

(12) United States Patent
Yde et al.

(10) Patent No.: US 12,111,571 B2
(45) Date of Patent: Oct. 8, 2024

(54) METHOD OF, AND APPARATUS FOR, SIMULTANEOUS DUAL-SIDED IMPRINTING

(71) Applicant: Stensborg A/S, Roskilde (DK)

(72) Inventors: Leif Yde, Copenhagen (DK); Jan Fagerbo Stensborg, Sjællands Odde (DK)

(73) Assignee: Stensborg A/S, Roskilde (DK)

( * ) Notice: Subject to any disclaimer, the term of this patent is extended or adjusted under 35 U.S.C. 154(b) by 0 days.

(21) Appl. No.: 17/323,225

(22) Filed: May 18, 2021

(65) Prior Publication Data

US 2021/0364913 A1    Nov. 25, 2021

(30) Foreign Application Priority Data

May 22, 2020    (GB) ..................................... 2007735

(51) Int. Cl.
*G03F 7/00* (2006.01)
(52) U.S. Cl.
CPC .................................. *G03F 7/0002* (2013.01)
(58) Field of Classification Search
CPC ..................................................... G03F 7/0002
See application file for complete search history.

(56) References Cited

U.S. PATENT DOCUMENTS

| 5,480,596 A * | 1/1996 | Okubo ...................... B05C 1/12 |
| | | 264/1.6 |
| 2018/0059477 A1 * | 3/2018 | Jang .................. G02F 1/133308 |
| 2019/0291498 A1 * | 9/2019 | Lister ..................... B42D 25/41 |

FOREIGN PATENT DOCUMENTS

| CN | 103400534 A | * | 11/2013 |
| CN | 103869609 A | * | 6/2014 |

(Continued)

OTHER PUBLICATIONS

Barcelo, Steven, and Zhiyong Li. "Nanoimprint lithography for nanodevice fabrication." Nano Convergence 3.1 (2016): 1-9.

(Continued)

*Primary Examiner* — Nathan H Empie
(74) *Attorney, Agent, or Firm* — IPro, PLLC

(57) ABSTRACT

In an embodiment there is provided a method for simultaneous dual-sided direct imprinting of surface relief structures on a substrate, the method utilising an imprinting arrangement comprising first and second rotatable cylinders, each rotatable cylinder being arranged to carry at least one mould having a surface relief structure, at least one rotatable cylinder comprising a resilient layer located between a cylindrical outer surface of the respective rotatable cylinder and the respective mould, and the rotatable cylinders being movable with respect to one another and arranged to form an imprinting nip therebetween, the imprinting nip having an imprinting contact area, wherein the method comprises the steps of: a) providing to the imprinting nip a substrate comprising first and second sides each having a curable medium thereon; b) directly imprinting surface relief structures into the curable medium on both the first and second sides of the substrate by passing the substrate through the imprinting nip and engaging, in the imprinting contact area, a first mould on the first rotatable cylinder with the curable medium on the first side of the substrate and a second mould on the second rotatable cylinder with the curable medium on the second side of the substrate; and c) illuminating at least a part of the curable media on the first and second sides of the substrate with curing radiation to at least partially cure the curable media on the substrate.

18 Claims, 4 Drawing Sheets

(56) References Cited

FOREIGN PATENT DOCUMENTS

| | | | |
|---|---|---|---|
| CN | 209478946 U | 10/2019 | |
| GB | 1528988 A | 10/1978 | |
| GB | 2576921 A | 3/2020 | |
| GB | 2576922 A | 3/2020 | |
| JP | H05297225 A | 11/1993 | |
| JP | 2008298962 A | 12/2008 | |
| JP | 2017030159 A | 2/2017 | |
| KR | 2009002815 A * | 1/2009 | .............. B41K 3/00 |

OTHER PUBLICATIONS

Chou, Stephen Y., Peter R. Krauss, and Preston J. Renstrom. "Nanoimprint lithography." Journal of Vacuum Science and Technology B: Microelectronics and Nanometer Structures Processing, Measurement, and Phenomena 14.6 (1996): 4129-4133.

* cited by examiner

METHOD OF, AND APPARATUS FOR, SIMULTANEOUS DUAL-SIDED IMPRINTING

TECHNICAL FIELD

The present invention relates to a method of, and apparatus for, dual sided imprinting of functional structures.

BACKGROUND

Nanoimprint Lithography (NIL) is a widely used technology for replicating nano- and micro-structures for a range of scientific and industrial applications. Commonly, wafers of silicon or silica (quartz) are utilised as substrates due to their high surface quality and uniformity. Much of the equipment used for NIL is based on a transfer from a stamping mould holding the required nano- or micro-structure to the aforementioned substrate material. The substrate is typically coated with a curable medium such as a heat- and/or light-sensitive curable medium such as a resin, into which the surface relief structure is stamped. This is known as direct imprinting, where the mould shape is transferred directly into the curable medium/resin on the substrate.

The actual NIL process of transferring the surface relief structure to the substrate and resin typically is achieved by either heat curing or curing by electromagnetic radiation (typically UV light) in a combination with applied pressure over the entire surface. In other words, the surface relief structure is applied over the entire surface in a single stamp process. As the process takes place over the entire surface at the same time it is imperative that the substrate is kept even and the pressure is tightly controlled, otherwise imperfections and errors may occur.

It is also known to perform imprinting using a roll to roll process where a nip is formed between two rollers, and a mould and sample substrate comprising a curable medium are brought together at the nip. The imprinted sample is then cured using electromagnetic radiation (most commonly UV light) or heat curing. An example of such a system is shown in WO 00/30854.

SUMMARY

However, the above processes are only capable of single-sided imprinting. There are many applications where double-sided imprinting would be useful—for example, in the production of functional structures and optical elements such as diffraction gratings, holographic displays, plasmonics, and lab on a chip (LOC) devices.

Dual-sided imprinting poses significant technical challenges. It is known to imprint two sided substrates through staged imprinting. In this technique, one side is imprinted at a time, with a first roller printing a first side of the substrate at a first nip and a second roller imprinting a second side of the substrate at a second nip. However, such arrangements are cumbersome and bulky, and require significant coordination between the imprinting elements. For optical elements such as diffraction gratings, accurate and precise registration between gratings on each side of the substrate may be required and this is difficult to achieve using traditional methods.

Therefore, there is a technical problem in the art that known methods for producing dual-sided micro- and nano-scale surface relief structures are complex, inefficient and bulky. The present invention seeks, in embodiments, to address these problems.

According to a first aspect of the present invention, there is provided a method for simultaneous dual-sided direct imprinting of surface relief structures on a substrate, the method utilising an imprinting arrangement comprising first and second rotatable cylinders, each rotatable cylinder being arranged to carry at least one mould having a surface relief structure, at least one rotatable cylinder comprising a resilient layer located between a cylindrical outer surface of the respective rotatable cylinder and the respective mould, and the rotatable cylinders being movable with respect to one another and arranged to form an imprinting nip therebetween, the imprinting nip having an imprinting contact area, wherein the method comprises the steps of: a) providing to the imprinting nip a substrate comprising first and second sides each having a curable medium thereon; b) directly imprinting surface relief structures into the curable medium on both the first and second sides of the substrate by passing the substrate through the imprinting nip and engaging, in the imprinting contact area, a first mould on the first rotatable cylinder with the curable medium on the first side of the substrate and a second mould on the second rotatable cylinder with the curable medium on the second side of the substrate; and c) illuminating at least a part of the curable media on the first and second sides of the substrate with curing radiation to at least partially cure the curable media on the substrate.

In one embodiment, the method further comprises, prior to step a), the step of: d) applying curable medium to the first and/or second sides of the substrate.

In one embodiment, step d) further comprises, prior to step a), applying the curable medium by one or more of: flexographic printing; offset printing; inkjet printing; spin coating; or slot die coating.

In one embodiment, the curable medium is applied directly to the first and/or second sides of the substrate.

In one embodiment, step d) further comprises the step of: e) applying curable medium to at least one mould carried by the first rotatable cylinder and/or applying curable medium to at least one mould carried by the second rotatable cylinder prior to imprinting in the imprinting nip.

In one embodiment, the substrate comprises a continuous web and step a) comprises conveying the web to the imprinting nip; or wherein the substrate comprises a sheet, a wafer or a device and step a) comprises transporting the sheet, wafer or device to the imprinting nip.

In one embodiment, both rotatable cylinders comprise a resilient layer located between a cylindrical outer surface of the respective rotatable cylinder and the respective mould.

In one embodiment, the resilient layer comprises a material having a hardness in the range from 25 to 90 shore A and/or the resilient layer has a thickness between 1 and 5 mm and/or the resilient layer is formed from a polymeric, elastomeric or rubber material.

In one embodiment, the imprinting nip has an imprinting contact area which is smaller than the area of the substrate and the substrate is imprinted as the substrate passes through the imprinting contact area of the nip.

In one embodiment, the two rotatable cylinders have parallel axes of rotation and the two cylinders are arranged to rotate simultaneously.

In one embodiment, the imprinting arrangement further comprises a main body and a cylinder support assembly arranged, in use, to support the first and second rotatable cylinders such that at least one rotatable cylinder is movable relative to the main body.

In one embodiment, at least one of the cylinder support assemblies is movable relative to the main body to change the separation between the two rotatable cylinders and/or a force applied by one rotatable cylinder to the other rotatable cylinder and/or substrate.

In one embodiment, the imprinting arrangement further comprises a biasing means arranged, in use, to apply a force between the first and second rotatable cylinders and/or the substrate.

In one embodiment, the biasing means has a variable force. In one embodiment, the distance between the first and second rotatable cylinder is adjustable.

In one embodiment, step c) further comprises illuminating the substrate with at least one illumination arrangement.

In one embodiment, an illumination arrangement is located within the interior of one or both of the first and second rotatable cylinders and the or each illumination arrangement is operable to illuminate at least a portion of the substrate to at least partially cure the curable medium on both sides of the substrate.

In one embodiment, step c) further comprises: f) varying an illumination region with respect to the location of the imprinting contact area.

In one embodiment, the illumination region is varied in step f) such that:
  i) the illumination overlaps at least a part of the imprinting contact area;
  ii) is arranged ahead of the imprinting contact area of the imprinting nip such that at least a portion of the substrate is illuminated prior to reaching the imprinting contact area of the nip; or
  iii) is arranged behind of the imprinting contact area such that at least a portion of the substrate is illuminated after passing through the imprinting contact area.

In one embodiment, step b) further comprises: g) rotatably driving at least one rotatable cylinder.

In one embodiment, both rotatable cylinders are driven by one or more motors; or one rotatable cylinder is driven by a motor and the other rotatable cylinder is driven by contact with the first rotatable cylinder in the imprinting nip.

In one embodiment, the two cylinders are arranged to rotate with synchronised surface speed.

According to a second aspect of the present invention, there is provided an apparatus for simultaneous dual-sided direct imprinting of surface relief structures on a substrate comprising first and second sides each having a curable medium thereon, the apparatus comprising: an imprinting arrangement comprising first and second rotatable cylinders, each rotatable cylinder being arranged to carry at least one mould having a surface relief structure and at least one rotatable cylinder comprising a resilient layer located between a cylindrical outer surface of the respective rotatable cylinder and the respective mould, the apparatus being configured and arranged such that, in use, the first and second rotatable cylinders are movable with respect to one another and arranged to define an imprinting nip therebetween, the imprinting nip having an imprinting contact area where, in use, a first mould on the first rotatable cylinder engages with the curable medium on the first side of the substrate and a second mould on the second rotatable cylinder engages with the curable medium on the second side of the substrate to directly imprint surface relief structures into the curable medium on both the first and second sides of the substrate; and an illumination arrangement configured and arranged to illuminate at least a part of the curable media on the first and second sides of the substrate with curing radiation to at least partially cure the curable media on the substrate.

In one embodiment, the apparatus further comprises an application arrangement is configured to apply curable medium to the first and/or second sides of the substrate.

In one embodiment, the application arrangement comprises one or more of: a flexographic apparatus; an offset printing apparatus; an inkjet printing apparatus; a spin coating apparatus; or a slot die coating apparatus.

In one embodiment, the application arrangement is configured to apply the curable medium directly to the first and/or second sides of the substrate.

In one embodiment, the application arrangement is configured to apply curable medium to at least one mould carried by the first rotatable cylinder and/or to apply curable medium to at least one mould carried by the second rotatable cylinder.

In one embodiment, the substrate comprises a continuous web arranged, in use, to be conveyed to the imprinting nip; or wherein the substrate comprises a sheet, a wafer or a device and the apparatus further comprises a stage to transport the sheet, wafer or device to the imprinting nip.

In one embodiment, both rotatable cylinders comprise a resilient layer arranged on the cylindrical outer surface between the respective rotatable cylinder and the respective mould.

In one embodiment, the resilient layer comprises a material having a hardness in the range from 25 to 90 shore A and/or wherein the resilient layer has a thickness between 1 and 5 mm and/or wherein the resilient layer is formed from a polymeric, elastomeric or rubber material.

In one embodiment, the imprinting nip has an imprinting contact area which is smaller than the area of the substrate and the substrate is imprinted as the substrate passes through the imprinting contact area of the nip.

In one embodiment, the two rotatable cylinders have parallel axes of rotation and the two cylinders are arranged to rotate simultaneously.

In one embodiment, the imprinting arrangement further comprises a main body and a cylinder support assembly arranged, in use, to support the first and second rotatable cylinders such that at least one rotatable cylinder is movable relative to the main body.

In one embodiment, at least one of the cylinder support assemblies is movable relative to the main body to change the separation between the two rotatable cylinders and/or a force applied by one rotatable cylinder to the other rotatable cylinder and/or substrate.

In one embodiment, the imprinting arrangement further comprising a biasing means arranged, in use, to apply a force between the first and second rotatable cylinders and/or the substrate.

In one embodiment, the biasing means has a variable force.

In one embodiment, the distance between the first and second rotatable cylinder is adjustable.

In one embodiment, the illumination arrangement is located within the interior of one of the first and second rotatable cylinders and operable to illuminate at least a portion of the substrate to at least partially cure the curable medium on both sides of the substrate or wherein the illumination arrangement comprises first and second illumination arrangements located within the interior of each the first and second rotatable cylinders respectively, each illumination arrangement being operable to illuminate at least a portion of the substrate to at least partially cure the curable medium on a respective side of the substrate.

In one embodiment, the illumination arrangement is configured to vary an illumination region with respect to the location of the imprinting contact area.

In one embodiment, both rotatable cylinders are driven by one or more motors; or one rotatable cylinder is driven by a motor and configured to drive the other rotatable cylinder through contact in the imprinting nip; and/or the two cylinders are arranged to rotate with synchronised surface speed.

BRIEF DESCRIPTION OF FIGURES

Embodiments of the present invention will now be described in detail with reference to the accompanying drawings, in which.

DETAILED DESCRIPTION

The present invention relates to, in embodiments, a method of, and apparatus for, dual-sided nanoimprint lithography (NIL) imprinting operable to imprint nano- and microscale surface relief structures for use in functional structures. A non-exhaustive list of such functional structures may comprise: lab-on-a-chip structures; diffractive optical elements; wave-guides; plasmonic structures and other imprinted structures such as holograms.

Figure 1:
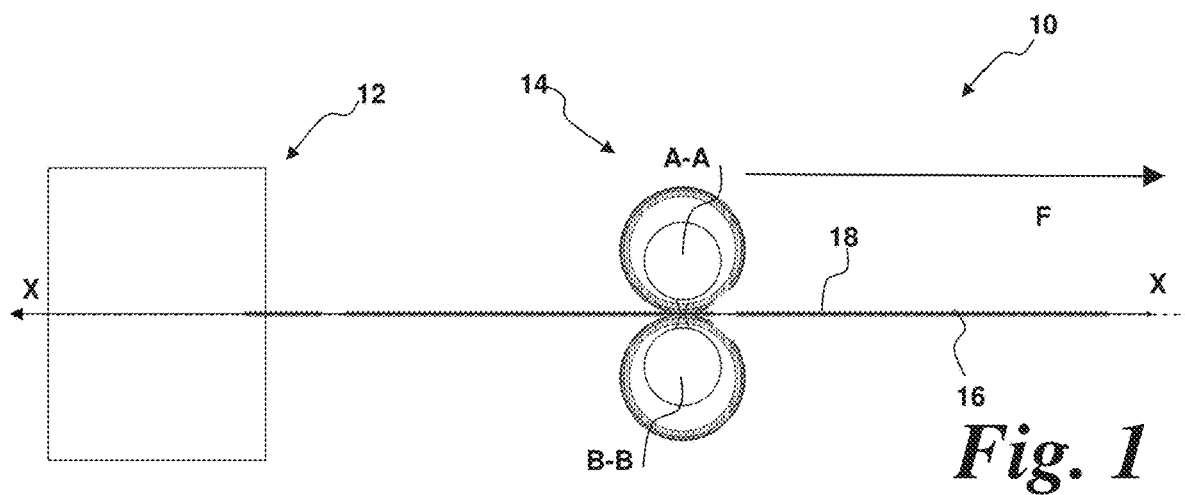
FIG. 1 shows a schematic side view of a dual-sided NIL imprinter according to an embodiment of the present invention.

An embodiment of the present invention will now be described with reference to FIGS. 1 to 3. FIG. 1 shows a schematic diagram of dual-sided nanoimprint lithography imprinter 10. The imprinter 10 comprises a medium applicator 12 and an imprinting arrangement 14.

A substrate 16 is provided which is movable, in use, from the medium application arrangement 12 to the imprinting arrangement 14. In this embodiment, as shown the substrate 16 takes the form of a continuous web. This web may be flexible.

However, this need not be the case and other substrate types, for example, sheets, wafers or foils may be used. Additionally, or alternatively, the substrate 16 may comprise a device such as a photovoltaic element or a light emitting device (LED), or may be a microfluidic or plasmonic device. Non-limiting variants will be described later.

Where a rigid substrate 16 is provided (for example, a wafer), a support mechanism such as a movable table (not shown) is required to hold and transport the substrate 16 between the medium application arrangement 12 and the nip N of the imprinting arrangement.

The medium applicator 12 is constructed and arranged to apply, in use, a curable medium 18 to both upper and lower sides of the substrate 16. The construction and operation of the medium applicator 12 is not material to the present invention and may take any suitable form. In non-limiting examples; a flexographic printing mechanism (see the third embodiment of FIG. 4); an inkjet printer; or a spin coater.

Whilst different examples are shown and described in the following embodiments, these are not to be taken as limiting and any suitable method of applying a curable medium to both sides of a substrate may be used.

The curable medium 18 comprises any medium which can be applied to both the upper and lower surfaces of the substrate 16 and which can be imprinted and cured. By this is meant that the curable medium 18 comprises a generally malleable, amorphous and/or deformable material which can be applied to the substrate 16 and which, after undergoing a curing process, will set into a permanent or semi-permanent desired fixed structure. The curable medium 18 may, in an uncured state, generally take the form of a viscous flowable medium such as a resin or may take any other form (e.g. a deformable curable solid layer).

Once the curable medium 18 is applied to the substrate 16, the completed substrate and curable medium then pass through the imprinting arrangement 14 where a surface relief structure is imprinted into the curable medium 18 on both sides of the substrate 16 substantially simultaneously and cured to produce a permanent or semi-permanent surface relief structure on the substrate 16.

The detail and operation of the imprinting arrangement 14 will be described with reference to FIGS. 2 and 3.

Figure 2:
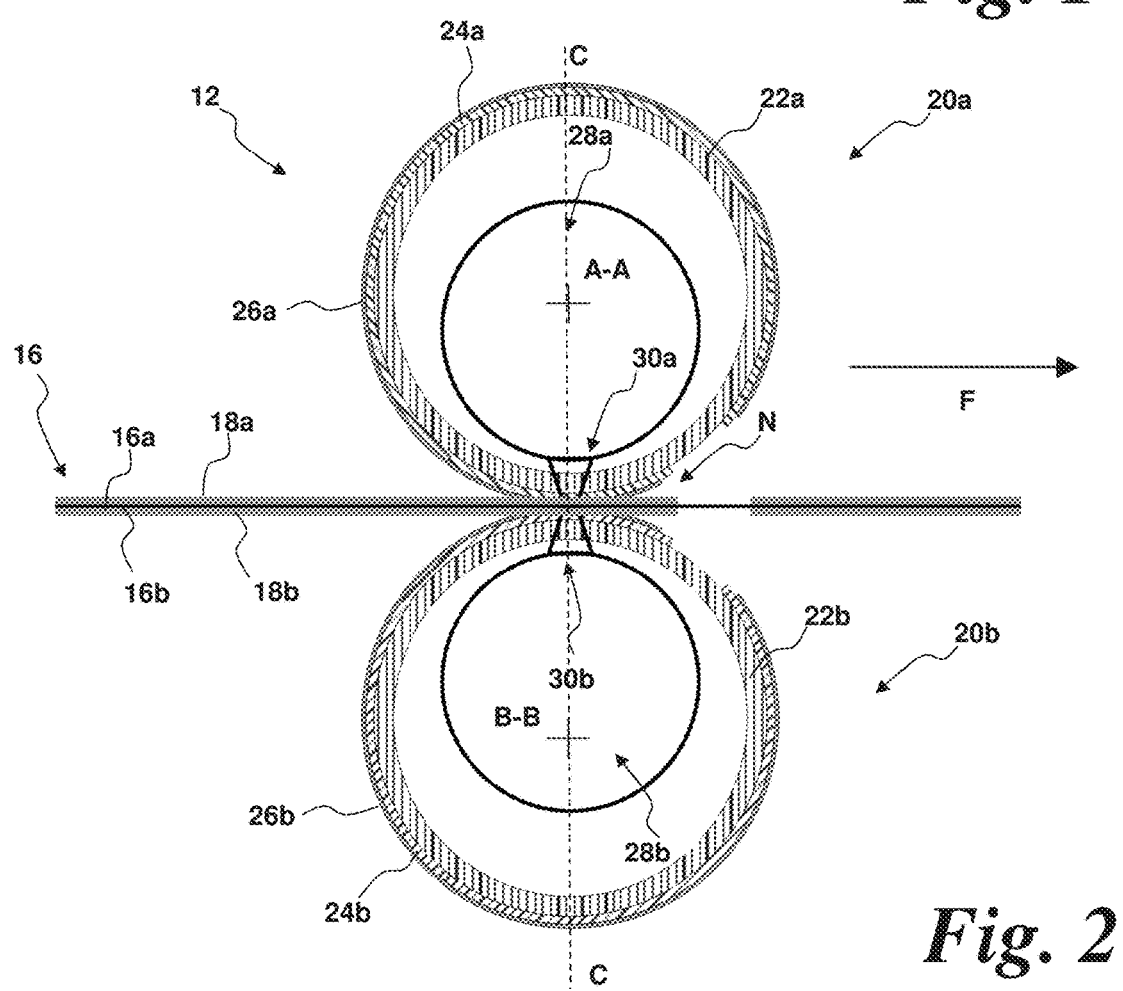
FIG. 2 shows a view of an imprinting section of the imprinter.

FIG. 2 shows a magnified view of the imprinting arrangement 14 shown in FIG. 1. FIG. 3 shows a yet further magnified view of an imprinting nip N of the imprinting arrangement 14.

The imprinting arrangement 14 is configured and arranged to imprint surface relief patterns into the curable medium 18a, 18b on each of the respective first and second sides 16a, 16b of the substrate 16 substantially simultaneously. By this is meant that the imprinting of a surface relief structure into the curable medium 18a, 18b on each side 16a, 16b of the substrate 16 occurs together in a single functional step. Put another way, imprinting of a surface relief pattern on both sides of the substrate 16 can be achieved by the substrate 16 passing through only a single nip defined by the imprinting arrangement 14. Further, the surface relief patterns need not be imprinted directly opposite one another. For example, the surface relief patterns on opposing sides may be offset in the feed direction F but imprinted through the same nip N in a single process step.

The imprinting arrangement 14 may take any suitable form. However, turning to FIGS. 2 and 3 in detail, in this embodiment, the imprinting arrangement 14 comprises two rotatable cylinders 20a, 20b which define a printing nip N therebetween.

The printing nip N is defined by the point where spacing between the cylinders 20a, 20b is smallest. At this point, the curable media 18a, 18b on both sides 16a, 16b of the sample substrate 16 is imprinted with the pattern from the moulds as will be described later.

The rotatable cylinders 20a, 20b are rotatably supported and arranged to rotate about a respective cylinder axes A-A, B-B. In this embodiment, each rotatable cylinder 20a, 20b has a cylinder body 22a, 22b which is at least partially formed from a transparent or translucent material such as quartz, glass or a plastic material. In this context, the terms "transparent" and "translucent" are intended to mean at least partially transparent or translucent to wavelengths of electromagnetic radiation used for curing the sample substrate as will be described later. This may include, but is not limited to, UV-radiation, visible light radiation and IR radiation (for example, near infrared light).

In this embodiment, the cylinder bodies 22a, 22b may have a material thickness of 5 mm. However, any suitable thickness could be used, for example, between 3-15 mm.

As described above, in order to create the required nip between the rotatable cylinders 20a, 20b, it is necessary to provide a layer of soft material on each cylinder body 22a, 22b to enable the formation of a suitable nip.

In this regard, each cylinder 20a, 20b has a respective soft layer 24a, 24b arranged around at least a part of the circumference of each respective cylinder body 22a, 22b.

In one embodiment, the surface of each of the cylinder bodies 22a, 22b is partly covered with a soft layer 24a, 24b of even thickness. The soft layers 24a, 24b are formed from deformable and/or resilient materials. In non-limiting embodiments, the hardness of the soft layers 24a, 24b may be in the range from 25 to 90 shore A.

The soft layers 24a, 24b have a hardness which is less than that of the cylindrical bodies 22a, 22b. In other words, the cylindrical bodies 22a, 22b are used as rigid or semi-rigid and transparent/translucent support surfaces to apply compression forces to/on either side of the substrate 16, whilst the soft layers 24a, 24b are arranged to deform to form the nip N therebetween.

Each cylinder 20a, 20b has a respective mould 26a, 26b mounted on top of the respective soft layer 24a, 24b. The moulds 26a, 26b may extend around some or all of the circumference of the respective cylinder bodies 22a, 22b as required. The moulds 26a, 26b may be arranged in any configuration. They may be arranged to cooperate and provide imprinted surface relief patterns on both surfaces which are in registration with one another, or the patterns so produced may be offset either laterally or longitudinally as required.

The moulds 26a, 26b may take any suitable form. However, in general they will be formed from a flexible material which is operable to conform to the curvature of the cylinder bodies 22a, 22b and which is transparent to the curing electromagnetic radiation used. The moulds may be formed from any suitable material for electromagnetic radiation-based curing applications, for example, a polymeric material such as Polydimethylsiloxane (PDMS), Cyclic Olefin Copolymer (COC), Polyethylene (PE), Polymethylpentene (PTX), Polypropylene (PP) or an epoxy or other suitable light curing resin/polymers. The moulds comprise a pre-defined surface relief structure, the surface relief structure being arranged to be imprinted in the curable media 18a, 18b of the sample substrate 16.

The moulds 26a, 26b are placed on the respective cylinders 20a, 20b in a position which will ensure that the moulds are in register with, and rotatably aligned with, the substrate 16 so that when the substrate 16 is moved to the nip N, the moulds 26a, 26b will engage with the sample substrate 16 in the correct orientation and spatial location to transfer the desired pattern to the substrate.

In embodiments, the soft layers 24a, 24b are resilient and have a thickness between 1 and 5 mm, preferably between 2 and 3 mm, preferably 2 mm. A plastic, synthetic polymeric, elastomeric or rubber material may be suitable. In examples, sheets of soft poly-vinyl chloride (PVC) are used.

In operation, the soft layers 24a, 24b can be deformed under pressure and the respective moulds 26a, 26b will follow the deformed surface of the respective soft layer 24a, 24b. This way the nip N can be formed between the soft layers 24a, 24b and it will be possible to imprint on a range of substrates 16 including continuous webs but also hard substrates like glass and wafers.

Figure 3:
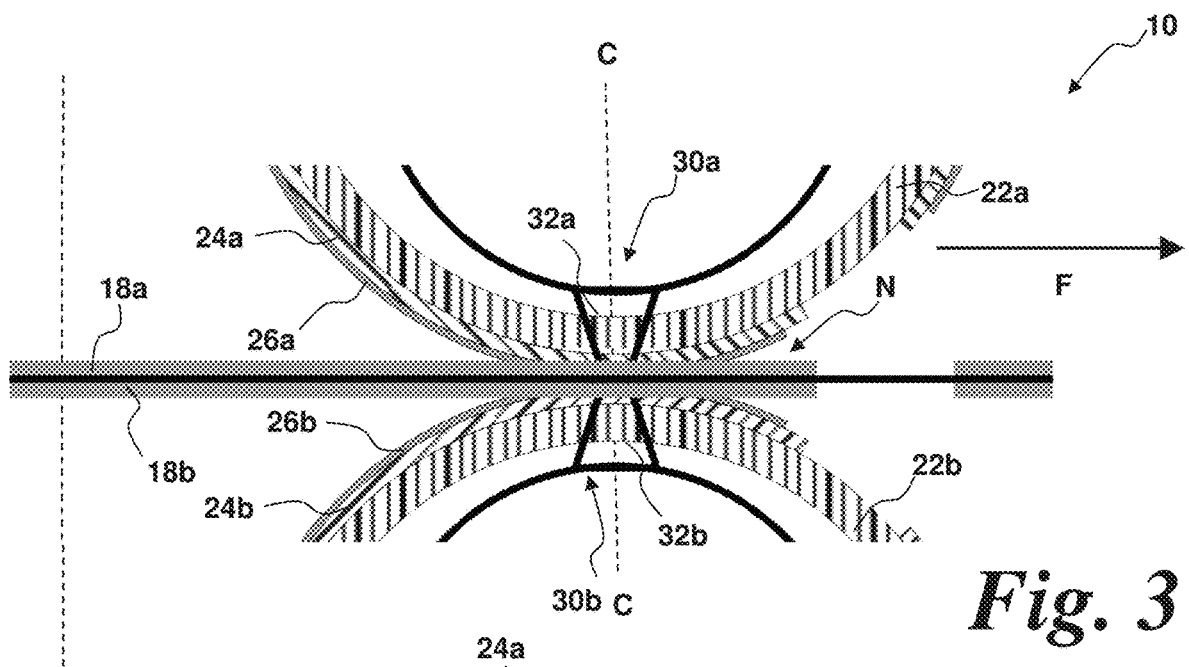
FIG. 3 shows a magnified schematic view of a nip formed in the imprinting section of FIG. 2.

FIG. 3 shows the formation of the nip N between the soft layers 24a, 24b to define an imprinting contact area.

In use, the substrate 16 will move in the direction F along axis X-X towards and through the nip N. This may occur in any suitable manner. If the substrate 16 used is a web, then a roll-to-roll process may be used and a continuous web of substrate (as shown in the attached figures) may be driven forward in the direction F by means of a motor driving a roller or other drive means (not shown). If a batch process substrate (e.g. a wafer etc.) is used, then a suitable motor drive stage may be used to advance the substrate 16 linearly towards the nip N.

The rotatable cylinders 20a, 20b are also driven, either through indirect drive from the movement of the substrate 16/web or through their own motor drive system.

A single motor may drive one or both rotatable cylinders 20a, 20b through suitable gearing (not shown). Alternatively, a motor may be provided for each cylinder 20a, 20b. As a further alternative, a motor may drive one cylinder 20a and the second cylinder 20b will rotate through engaging friction at the nip N.

Since the substrate 16 has a curable medium 18a, 18b on each side 16a, 16b thereof, it is necessary to define the nip N between the two layers of soft material 24a, 24b. However, if a flexible web is used, then a soft layer may be provided on only a single rotatable cylinder 20a, 20b. Alternatively or additionally, the soft layers 24a, 24b may have different hardnesses as required.

The nip N itself can be controlled in various ways. Firstly, the spacing between the axes A-A and B-B of the cylinders 20a, 20b can be varied so as to change the spacing at the nip N. This may be used to accommodate substrates 16 and/or curable media 18a, 18b of different thicknesses. This may, in non-limiting embodiments, be controlled by an eccentric cam arrangement or any other mechanical, electrical, pneumatic or hydraulic arrangement if required. One cylinder may be movable with respect to the other to define a fixed spacing therebetween. Cylinder 20a could be movable relative to cylinder 20b whilst cylinder 20b is fixed, or vice versa. Note that the support and movement structures are not shown in the attached drawings for clarity.

In addition, it is possible to arrange the cylinders 20a, 20b such that they are movable with respect to one another in use by a predefined amount. For example, the axes A-A, B-B need not be fixed with respect to one another and may, instead, be resiliently biased to apply a predetermined force therebetween. This may, in conjunction with the material properties of the soft layers 24a, 24b, be used to determine the force with which the respective moulds 26a, 26b and the respective curable media 18a, 18b are brought together.

In addition to imprinting in the nip N, the present method and apparatus also cures the curable media 18a, 18b in the nip N. In this regard, the imprinting arrangement 14 further comprises first and second optical engines 28a, 28b each located within the interior of a respective rotatable cylinder body 22a, 22b. The optical engines 28a, 28b are shown schematically in FIGS. 1 to 3. Each optical engine 28a, 28b is arranged to project a focused high intensity pattern of electromagnetic radiation onto a portion of the respective curable medium 18a, 18b on the substrate 16. In embodiments, the electromagnetic radiation is operable to cure the curable medium 18a, 18b as the substrate 16 passes through the nip N. It is preferred to cure the curable media 18a, 18b substantially simultaneously whilst in the nip N.

In embodiments, each optical engine 28a, 28b comprises an illumination source which may illuminate the curable medium 18a, 18b with, for example, UV-radiation, visible light radiation or IR radiation.

In this embodiment, the optical engines 28a, 28b comprises an illumination source operable to generate curing electromagnetic radiation at UV wavelengths. Such an illumination source may take any suitable form; for example, mercury arc lamps; a plurality of light emitting diodes (LEDs) forming an illumination strip; or a plurality of laser diodes.

If LEDs are utilised, they may take the form of surface mount technology (SMT) LED emitters having a centre wavelength of 395 nm. However, other illumination sources could be used in the range of 360 to 405 nm with specific examples of UV LEDs which are available at 360 nm, 365 nm, 385 nm and 405 nm.

The illumination source illuminates the curing media through respective apertures 30a, 30b which extend in a width direction. The curing radiation is transmitted through the respective transparent cylinder body 22a, 22b to the respective curing medium 18a, 18b on the sample substrate 16.

The illumination source may be focused by a lens arrangement which is operable to focus the emission into a narrow, high intensity beam line 32a, 32b in a region on or adjacent the outer surface of the respective mould 26a, 26b on the respective cylinder 20a, 20b.

In embodiments, the illumination beam line has a width in the range from 0.5 to 10 mm, preferably in the range from 1 to 5 mm.

As shown in FIG. 3, the beam line is projected along an axis C-C which, in FIG. 3, is substantially vertical and perpendicular to the substrate (see FIG. 1) although this need not be the case.

However, in embodiments, the location and configuration of each beam line can be adjusted as required. For example, the vertical positioning of the illumination source can be altered as desired to adjust the focal point of the illumination source with respect to the outer surface of the mould 26a, 26b when in place on the cylinder 22 or to change the width of the beam line.

It is desired that the beam width of the illumination beam is narrower than the width of the nip N. By using this arrangement, the whole of the curing energy can be used whilst the curing medium 18a, 18b on each side 16a, 16b of the substrate 16 is under pressure in the nip N, resulting in an improved replication of the structure of the mould 26a, 26b.

As will be described in detail below, each beam line 32a, 32b is intended to act as curing source to cure the respective curable media 18a, 18b on the sample substrate 16.

However, it may be desired to alter the point at which the sample is cured as it passes through the nip N in order to improve the imprint or other such properties of the sample. For example, it may be desirable to partially cure the sample, or to initiate the curing process, shortly prior to imprinting with the mould. Alternatively, it may be desirable to cure the sample only after the sample has passed through some or all of the nip N.

To enable fine tuning of this function, the location of the beam line relative to the nip N between the cylinders 22a, 22b can be adjusted. This may be achieved by rotation or translation of the optical engine and illumination source. This may be done independently for each optical engine.

The nip geometry N with a pair of opposed illumination sources inside the two transparent imprint cylinders 22a, 22b furthermore ensures that sufficient and accurate curing can take place. In addition, this arrangement facilitates the use of substrates that are not sufficiently transparent to the curing radiation.

Figure 4:
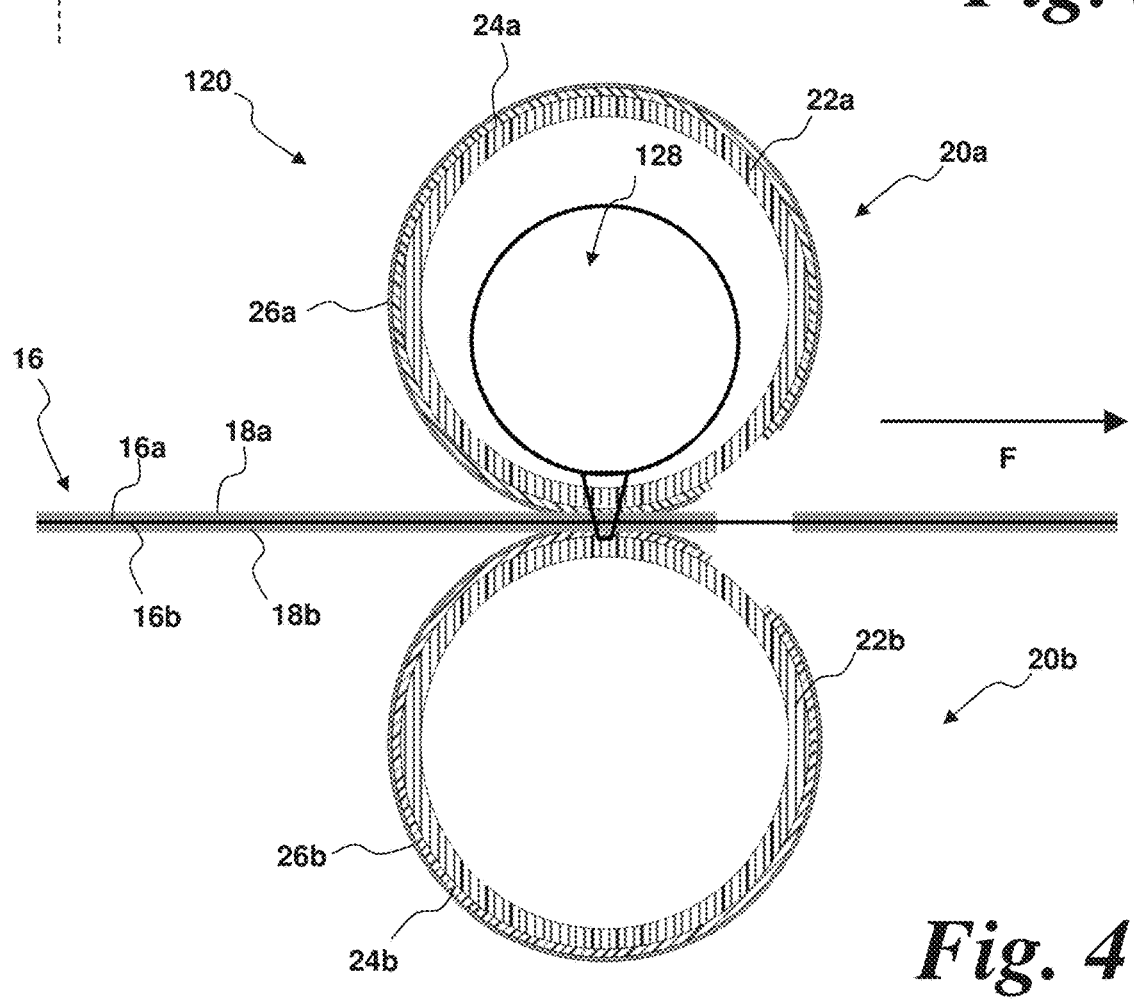
FIG. 4 shows a second embodiment of the present invention.

However, alternative embodiments may be used. FIG. 4 shows a second embodiment of a dual-sided nanoimprint lithography imprinter 120. The features of the dual-sided nanoimprint lithography imprinter 120 which correspond to the first embodiment are shown with the same reference numerals and will not be discussed further here.

However, in contrast to the first embodiment, the second embodiment only utilises a single optical engine 128. The optical engine 128 is configured to illuminate both upper and lower curable media 18a, 18b with a single illumination source. This may, for example, be appropriate when using a transparent (to the curing radiation) web substrate 16 or a glass substrate.

This may be appropriate in certain circumstances, for example, to reduce costs and complexity of the apparatus. However, careful design is needed to ensure that both the curable medium 18a on the first side 16a of the substrate 16 and the curable medium 18b on the second side 16b of the substrate 16 cure at sufficiently equal rates.

Figure 5:
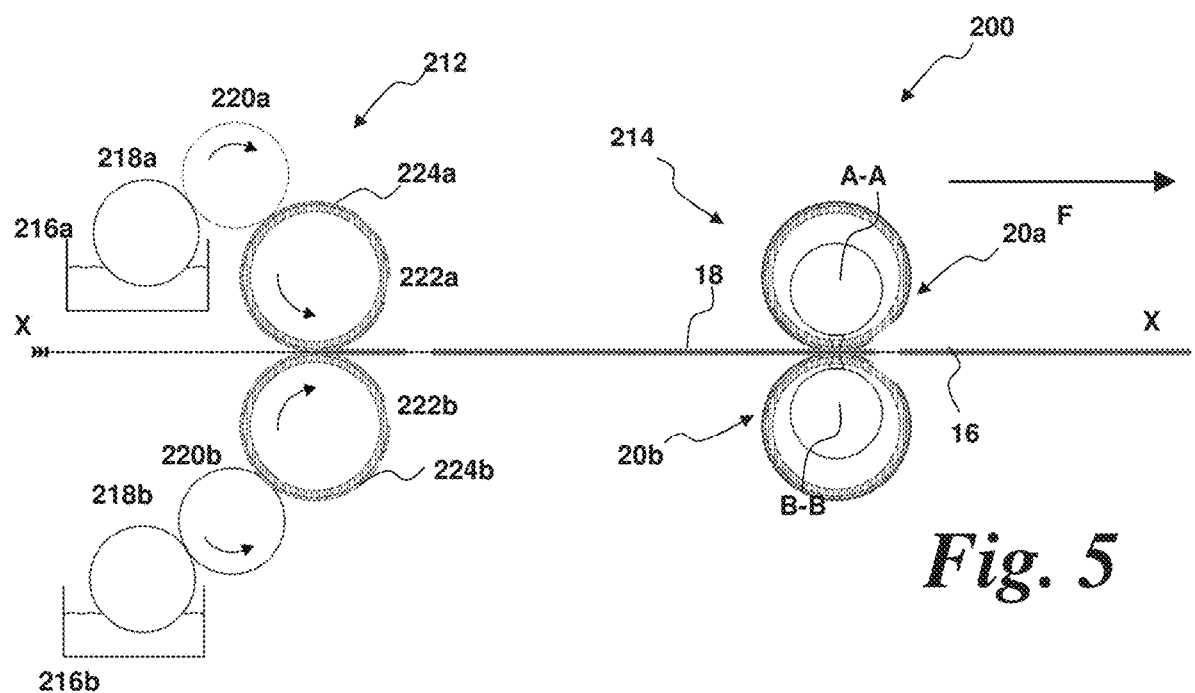
FIG. 5 shows a third embodiment of the present invention.

A third embodiment is shown in FIG. 5. In FIG. 5 the dual-sided nanoimprint lithography imprinter 200 comprises a medium application arrangement 212 and an imprinting arrangement 214. The medium application arrangement 212 comprises a flexo-printing apparatus to apply a curable medium to both sides of a substrate.

The flexo-printing apparatus 212 comprises, for each surface 16a, 16b of the substrate 16, a reservoir 216a, 216b, a pair of transporting rollers 218a, 218b, 220a, 220b and a cliché roller 222a, 222b having a printing plate 224a, 224b thereon.

In use, the reservoirs 216a, 216b are filled with curable medium, and the curable medium is transported by rollers 218a, 218b, 220a, 220b to the print plates 224a, 224b which each apply curable medium 18a, 18b to each respective side 16a, 16b of the substrate 16 prior to imprinting.

The imprinting technique for this embodiment is then identical to either the first or second embodiments.

Figure 6:
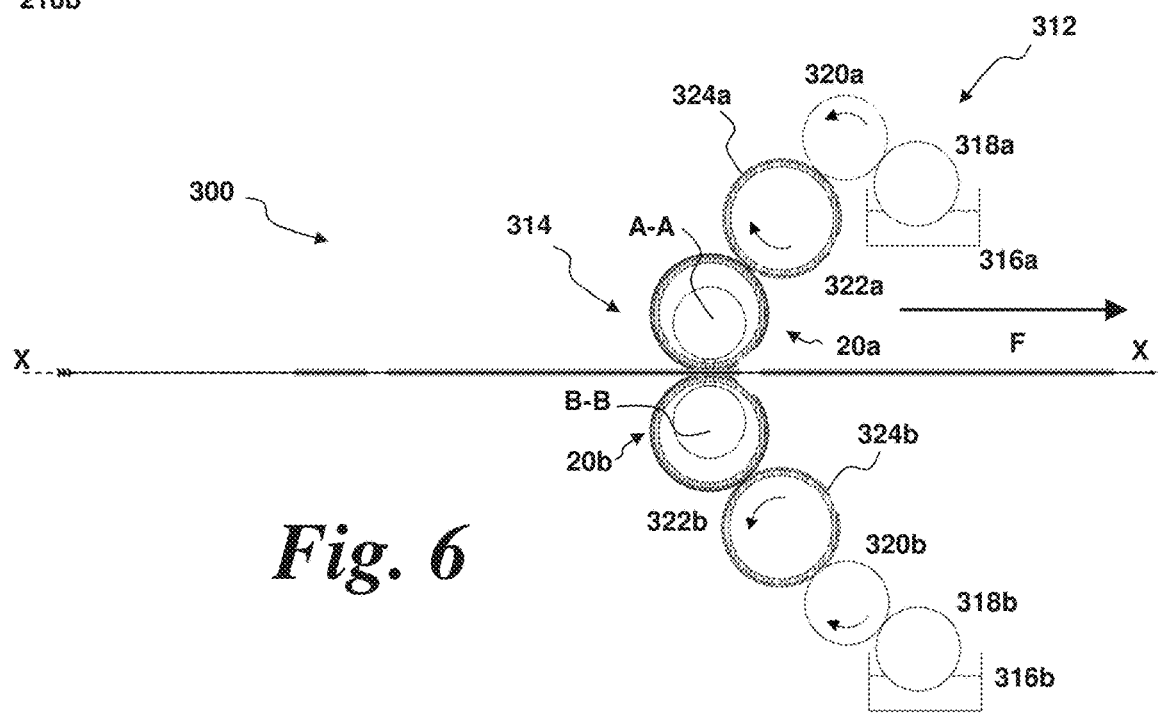
FIG. 6 shows a fourth embodiment of the present invention.

FIG. 6 shows a fourth embodiment of the present invention in the form of a dual-sided nanoimprint lithography imprinter 300. The imprinting arrangement 300 comprises a medium application arrangement 312 and an imprinting arrangement 314. The medium application arrangement 312 comprises a flexo-printing apparatus. However, in this embodiment, the flexo-printing apparatus is configured to apply curable medium to the moulds 26a, 26b on the respective cylinders 20a, 20b.

The flexo-printing apparatus 312 comprises, for each rotatable cylinder 20a, 20b, a reservoir 316a, 316b, a pair of transporting rollers 318a, 318b, 320a, 320b and a cliché roller 322a, 322b having a printing plate 324a, 324b thereon.

In use, the reservoirs 316a, 316b are filled with curable medium 18, and the curable medium 18 is transported by rollers 318a, 318b, 320a, 320b to the print plates 324a, 324b which each apply curable medium 18a, 18b to the respective moulds 26a, 26b prior to imprinting.

The curable medium 18 is then applied to the substrate 16 by engagement between the moulds 26a, 26b carrying the curable medium 18 and the sides 16a, 16b of the substrate 16 prior to passing through the nip N. A direct imprint of the surface relief structure of the moulds 26a, 26b is then imprinted into the layers of curable medium 18a, 18b deposited on the surfaces 16a, 16b of the substrate 16 as described above.

Figure 7:
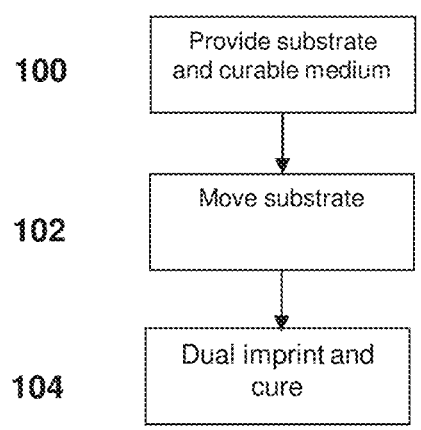
FIG. 7 shows a method according to the present invention.

Additionally or alternatively, combinations of the first to third embodiments and the fourth embodiment may be used. For example, curable medium may be applied in use to both the surfaces 16a, 16b of the substrate 16 and also to the moulds 26a, 26b in use. This dual application may have specific benefits in forming functional structures. A method of operation of the imprinter will now be described with reference to FIG. 7. FIG. 7 shows a flow chart of the method according to an embodiment of the present invention.

Step 100: Provide Substrate and Curable Medium

At step 100, the imprinter 10; 120; 200 is prepared for imprinting by providing the substrate and the curable medium.

The sample substrate 16 may comprise any elements suitable for receiving a surface relief structure through imprinting. The sample substrate 16 may comprise a continuous length of web (as shown in the attached drawings) but may also comprise a wafer, a sheet or a foil substrate, or may be a device such as a photovoltaic element or a light emitting device (LED), or may be a microfluidic or plasmonic device. In general, the substrate will have a first and second surfaces 16a, 16b which are each partially or fully covered by a radiation-curable medium 18a, 18b into which an imprint can be made to form a surface relief structure.

This is an optional step of the process and the substrate may be provided complete with curable medium before starting the imprinting.

Alternatively, the curable medium may be applied to each side 16a, 16b of the substrate 16 on demand or through a roll-to-roll process. This may be by any suitable process, for example, flexo printing (as illustrated in FIG. 5), inkjet printing or spin coating.

If so desired, curable medium 18a, 18b is applied to both sides 16a, 16b of the substrate 16. This may be a continuous process (e.g. for a web) or it may be a batch process (e.g. for wafers, foils or devices).

Alternatively, curable medium 18a, 18b may be applied to the moulds 26a, 26b in this step as described in the fourth embodiment of FIG. 6 above.

Additionally or alternatively, curable medium 18a, 18b may be applied in use to both the surfaces 16a, 16b of the substrate 16 and also to the moulds 26a, 26b as described above. This dual application may have specific benefits in forming functional structures.

The method proceeds to step 102.

Step 102: Move Substrate

At step 102, the substrate 16 is moved towards the imprinting nip N in the direction F and along the axis X-X which takes the substrate 16 directly into the nip N delimited by the two cylinders 20a, 20b.

This may occur in any suitable manner. If the substrate 16 used is a web, then a roll-to-roll process may be used and a continuous web of substrate (as shown in the attached figures) may be driven forward in the direction F by means of a motor driving a roller or other drive means (not shown).

The rotatable cylinders 20a, 20b are also driven at this point, either through indirect drive from the movement of the substrate 16/web or through their own motor drive system.

A single motor (not shown) may drive one or both of the rotatable cylinders 20a, 20b through suitable gearing (not shown). Alternatively, a motor may be provided for each cylinder 20a, 20b. As a further alternative, a motor may drive one cylinder 20a and the second cylinder 20b will rotate through engaging friction at the nip N.

The cylinders 20a, 20b rotate with the linear motion of the substrate 16 and the curable media 18a, 18b on the substrate 16 is then brought into contact with the respective moulds 26a, 26b, each containing a surface relief pattern to be transferred to the respective curable medium 18a, 18b on the respective side 16a, 16b of the substrate 16 in the nip. The method proceeds to step 104.

Step 104: Dual Imprint and Cure Surface Relief Patterns

At step 104, the surface relief patterns formed into the surface of the moulds 26a, 26b are directly transferred to the curable media 18a, 18b (which may, in embodiments, take the form of curable resins) formed on the sample substrate 16 in the contact area between the respective moulds 26a, 26b and the respective first and second surfaces 16a, 16b in the nip N. This is shown in FIG. 3. The imprinting is done simultaneously on both sides of the substrate 16.

The surface relief pattern formed in each mould 26a, 26b is therefore transferred to the respective curable medium 18a, 18b in a process whereby the substrate passes substantially linearly through the imprinting nip N and the cylinders 20a, 20b rotate to imprint the surface relief patterns of the mould(s) into the curable medium as the substrate passes through.

The use of a narrow nip between the cylinders 20a, 20b carrying the moulds 26a, 26b and the sample substrate 16 reduces the need for strict pressure control of the moulds 26a, 26b and substrate 16 when compared to conventional NIL processes in which a full surface of the substrate is imprinted at once. As described above, the use of soft layers 24a, 24b enables a nip to be formed even when using inflexible and rigid sample substrates 16.

At this point, the illumination sources 30a, 30b (or single source 130 if used) is used to cure the curable medium 18a, 18b on each side 16a, 16b of the sample 16. As described above, the illumination source may be configured to illuminate the contact region in the nip between the moulds 26a, 26b and the sample substrate 16 in order to cure the curable media 18a, 18b immediately during the contact process. Alternatively or additionally, the angle of the illumination source may be altered to change the exposure region of the sample 16 to cure or partially cure the media 18a, 18b prior to engagement with the mould 26a, 26b in the contact area in the nip.

Alternatively or additionally, the angle of the illumination source 30a, 30b may be altered to change the exposure region of the substrate to cure the curable media only after the substrate has passed through some or all of the nip N.

Whilst the above discussion describes "curing" and "imprinting" of the curable media 18a, 18b of the sample substrate 16, this of course is in reference to a portion of the sample substrate 16 at any one time in a moving continuous process. Due to the narrow region of contact between the sample and the mould on each cylinder 20a, 20b, and the narrow beam width of the illumination sources 30a, 30b, only a part or strip of the curable media 18a, 18b on the sample substrate 16 will be imprinted and/or cured at any one time.

Naturally, the whole or selected part of the sample substrate 16 will be imprinted/cured as the sample substrate passes between the cylinders 20a, 20b, the imprinting contact area and out of the other side.

Through the imprinting process, the sample substrate may be formed into, for example: a diffractive optical element; a diffractive structure for optical verification of anti-counterfeiting; a nano- or micro-structured photovoltaic device; a nano- or micro-structured LED; an optical waveguide; a microfluidic device; or may comprise a functional surfaces, e.g. super hydrophilic or super hydrophobic surfaces, or a surface that promotes or prevents cell-growth, a surface for replication of plasmonic structures, micro-arrays for biochemical use, a surface for creating a NIL etching mask pattern or a test sample to determine and quantify the properties of photo-curable resins.

Additionally, the use of a narrow curing beam line from the illumination source 30 has numerous advantages over known arrangements. The use of a focused narrow beam line makes it possible to achieve a higher power density or intensity of the curing light and thereby a shorter processing time for the curing process. Once the imprinting and/or curing has been completed, the substrate passes through and out of the nip.

Variations will be apparent to the skilled person and the skilled person would be aware that the configuration of elements may be varied as appropriate. For example, the optical engine need not be located within the interior of the cylinder and may be located elsewhere—for example, at one side projecting in onto the region of the nip N.

As noted above, different illumination sources may be used such as lamps and other LED sources at different wavelengths. Indeed, curing may be carried out using a thermal source rather than a light source and thermally-cured resins may be used. In addition, whilst a narrow beam width is described, this need not be the case and a larger illumination area may be used.

In addition, multiple sources may be used and selected depending upon the type of resin or cure to be achieved. For example, different wavelength curing sources may be selected depending upon the absorption spectra of the selected curable medium.

Embodiments of the present invention have been described with particular reference to the examples illustrated. While specific examples are shown in the drawings and are herein described in detail, it should be understood, however, that the drawings and detailed description are not intended to limit the invention to the particular form disclosed. It will be appreciated that variations and modifications may be made to the examples described within the scope of the present invention.

The invention claimed is:

1. A method for simultaneous dual-sided direct nanoimprint lithography of surface relief structures on a substrate, the method utilising a nanoimprint lithography arrangement comprising first and second rotatable cylinders, each rotatable cylinder being arranged to carry at least one mould having a surface relief structure, each rotatable cylinder comprising a resilient layer located between a cylindrical outer surface of the respective rotatable cylinder and the respective mould, and the rotatable cylinders being movable with respect to one another and arranged to form an imprinting nip therebetween, the imprinting nip having an imprinting contact area, wherein the method comprises the steps of:
   a) providing to the imprinting nip a substrate comprising first and second sides each having a curable medium thereon;
   b) directly nanoimprinting surface relief structures into the curable medium on both the first and second sides of the substrate by passing the substrate through the imprinting nip and engaging, in the imprinting contact area, a first mould on the first rotatable cylinder with the curable medium on the first side of the substrate and a second mould on the second rotatable cylinder with the curable medium on the second side of the substrate; and
   c) illuminating, in the imprinting nip, at least a part of the curable media on the first and second sides of the substrate with curing radiation to at least partially cure the curable media on the substrate as the substrate passes through the imprinting nip;
   wherein step c) further comprises illuminating the substrate with at least one illumination arrangement having an illumination region located within the imprinting contact area; and
   wherein step c) further comprises varying the position of the illumination region within the imprinting contact area by rotating the illumination arrangement or translating the illumination arrangement in a direction parallel to the direction of movement of the substrate passing through the imprinting nip.

2. A method according to claim 1, wherein, prior to step a), the method further comprises the step of:
   d) applying curable medium to the first and/or second sides of the substrate.

3. A method according to claim 2, wherein step d) further comprises applying the curable medium by one or more of: flexographic printing; offset printing; inkjet printing; spin coating; or slot die coating.

4. A method according to claim 2, wherein the curable medium is applied directly to the first and/or second sides of the substrate.

5. A method according to claim 2, wherein step d) further comprises the step of:
   e) applying curable medium to at least one mould carried by the first rotatable cylinder and/or applying curable medium to at least one mould carried by the second rotatable cylinder prior to imprinting in the imprinting nip.

6. A method according to claim 1, wherein the substrate comprises a continuous web and step a) comprises conveying the web to the imprinting nip; or
   wherein the substrate comprises a sheet, a wafer or a device and step a) comprises transporting the sheet, wafer or device to the imprinting nip.

7. A method according to claim 1, wherein the resilient layer comprises a material having a hardness in the range from 25 to 90 shore A and/or the resilient layer has a thickness between 1 and 5 mm and/or the resilient layer is formed from a polymeric, elastomeric or rubber material.

8. A method according to claim 1, wherein step c) further comprises illuminating the substrate with at least one illumination arrangement, wherein an illumination arrangement is located within the interior of one or both of the first and second rotatable cylinders and the at least one illumination arrangement is operable to illuminate at least a portion of the substrate to at least partially cure the curable medium on at least one side of the substrate.

9. A method according to claim 1, wherein step b) further comprises:
   g) rotatably driving at least one rotatable cylinder.

10. A method according to claim 1, wherein the two cylinders are arranged to rotate with synchronised surface speed.

11. A method according to claim 1, wherein the illumination region is entirely within the imprinting contact area.

12. A method according to claim 11, wherein the illumination region is smaller than the imprinting contact area.

13. A method according to claim 1, wherein the illumination region comprises a beam line having a beam width narrower than the width of the imprinting contact area defined by the imprinting nip.

14. A method according to claim 13, wherein the beam width is in the range of 0.5 to 10 mm.

15. A method according to claim 1, wherein at least one of first and second rotatable cylinders is transparent or translucent.

16. A method according to claim 1, wherein the curing radiation is focused onto a portion of the curable medium on the substrate in the imprinting contact area.

17. A method according to claim 16, wherein the curing radiation is focused onto the portion of the curable medium on the substrate in the imprinting contact area while the substrate passes through the imprinting nip.

18. A method according to claim 1, wherein the nanoimprint lithography arrangement comprises an illumination source inside at least one of the first and second rotatable cylinders; wherein the curing radiation is emitted from the illumination source through the at least one of the first and second rotatable cylinders to the curable medium on the substrate.

\* \* \* \* \*